United States Patent [19]
Hachiya et al.

[11] Patent Number: 5,331,486
[45] Date of Patent: Jul. 19, 1994

[54] DISK UNIT WITH A DEVICE TO DIVERT LEADS FROM THE HEAD

[75] Inventors: Toshiyuki Hachiya, Yokohama; Kazunori Tochiyama, Kawasaki, both of Japan

[73] Assignee: Fujitsu Limited, Kanagawa, Japan

[21] Appl. No.: 67,970

[22] Filed: May 27, 1993

Related U.S. Application Data

[60] Division of Ser. No. 520,412, May 8, 1990, which is a continuation of Ser. No. 979,382, Nov. 19, 1992, Pat. No. 5,245,486.

[30] Foreign Application Priority Data

May 20, 1989 [JP] Japan .................................. 1-127508
May 20, 1989 [JP] Japan .................................. 1-127509

[51] Int. Cl.⁵ ............................................. G11B 5/012
[52] U.S. Cl. .............................. 360/97.01; 360/97.03
[58] Field of Search ............... 360/97.01, 97.03, 98.01, 360/104, 106

[56] References Cited
U.S. PATENT DOCUMENTS

| | | |
|---|---|---|
| 4,888,655 | 12/1989 | Bonn . |
| 4,890,176 | 12/1989 | Casey .................................. 360/105 |
| 4,930,029 | 5/1990 | Morita . |
| 5,060,095 | 10/1991 | Rigotti et al. . |
| 5,060,100 | 10/1991 | Mihara ............................ 360/98.01 |

*Primary Examiner*—A. J. Heinz
*Attorney, Agent, or Firm*—Nikaido, Marmelstein, Murray & Oram

[57]. ABSTRACT

In a disk unit containing in a predesignated size, an arm, read/write heads secured to an end of arm, a printed circuit board, and leads connecting read/write heads to the printed circuit board, the disk unit of the present invention is realized by:

employing a straight-type arm in place of a conventional dog-leg shaped arm; providing a structure for mounting a printed circuit board on a side of the disk unit where a space is made by employing the straight-type arm; moving a printed circuit board conventionally mounted above the disks to the above-mentioned space, thus evacuating the upper part of the disks; and providing additional disks in the above-mentioned evacuated upper part of the disks to increase storage capacity of a disk unit.

8 Claims, 8 Drawing Sheets

DISK UNIT WITH A DEVICE TO DIVERT LEADS FROM THE HEAD

This is a division, of application Ser. No. 07/520,412 filed on May 8, 1990; continued on Nov. 19, 1992 as application Ser. No. 07/979,382, now U.S. Pat. No. 5,245,486.

BACKGROUND OF THE INVENTION

1. Field of the Invention

The present invention relates to a disk unit, and more particularly to a magnetic disk unit used for an auxiliary storage of a computing system.

Recently, with the remarkable development of a computing system, more and more reliable, large-capacity and small-sized magnetic disk unit is being demanded.

2. Description of the Related Art

FIG. 1 is a perspective view of a magnetic disk unit of a related art, whose structures are disclosed in U.S. Pat. No. 4,889,237. A plurality of disks rotated by a not-depicted spindle are on the A side, and a positioner for positioning read/write heads is on the B side. Connector 92 leads disk read/write signals to/from not-depicted read/write heads. First printed circuit board (called PCA hereafter) 41, which is for controlling disk read/write operation, is mounted on the upper side of the unit with spacer tubes 44 between and has its connector 95 mated with connector 92. Third PCA 42, which is also for controlling disk read/write operation, is mounted on the rear side and is connected to first PCA 41 via their connectors (not depicted in the figure). Second PCA 43 is for controlling disk read/write and positioning operation according to the commands sent from a not-depicted disk controller via interface connector 35. Second PCA 43 is secured to metal fittings 48, 49 to mount on top of the unit and connected to first PCA 41 via connectors 93, 94 and cables 46. Plates 66 with rubber vibration isolator mounts the unit on a not-depicted cabinet.

A magnetic disk unit with, for example, 8-inch disks is generally predetermined to be up to 216mm(W)×127mm(H)×380mm(D) in dimensions to accommodate the unit in a standard cabinet. In the prior structure, however, there was no space for additional disks to increase storage capacity because of the limitation of height. Therefore, a problem is that in spite of an ever-increasing demand for a large-capacity magnetic disk unit, there was no means to satisfy the demand without increasing the size and deteriorating reliability.

SUMMARY OF THE INVENTION

An object of the present invention is to increase the storage capacity of a disk unit by increasing the number of disks within a disk unit of a predetermined size.

Another object of the present invention is to improve the reliability of a disk unit.

The first object is accomplished by employing a straight-type arm in place of a conventional dog-leg shaped arm, and moving a printed circuit board to a space vacated by employing the straight-type arm. Furthermore, by providing a bending metal to guide leads carrying disk read/write signals to/from the heads, the second object is accomplished.

The present invention has applied a straight-type arm to a disk unit designed conventionally with a dog-leg shaped arm because a straight-type arm swings over a smaller area than a dog-leg shaped arm.

The present invention has depressed a part of the base (which houses the disk unit proper) in a space where the straight-type arm does not swing, provided a structure for mounting a printed circuit board in the depressed portion, and moved therein a printed circuit board conventionally mounted above the disks. Thus, a space is provided in the direction of height, permitting addition of disks to increase storage capacity.

The present invention has also provided a bending metal as a means to divert the route of the leads carrying disk read/write signals to/from the heads so that it may not touch other parts of the disk unit.

BRIEF DESCRIPTION OF THE DRAWINGS

Throughout the above-mentioned drawings, identical reference numerals designate the same or similar component parts.

DESCRIPTION OF THE PREFERRED EMBODIMENT

Figure 2:
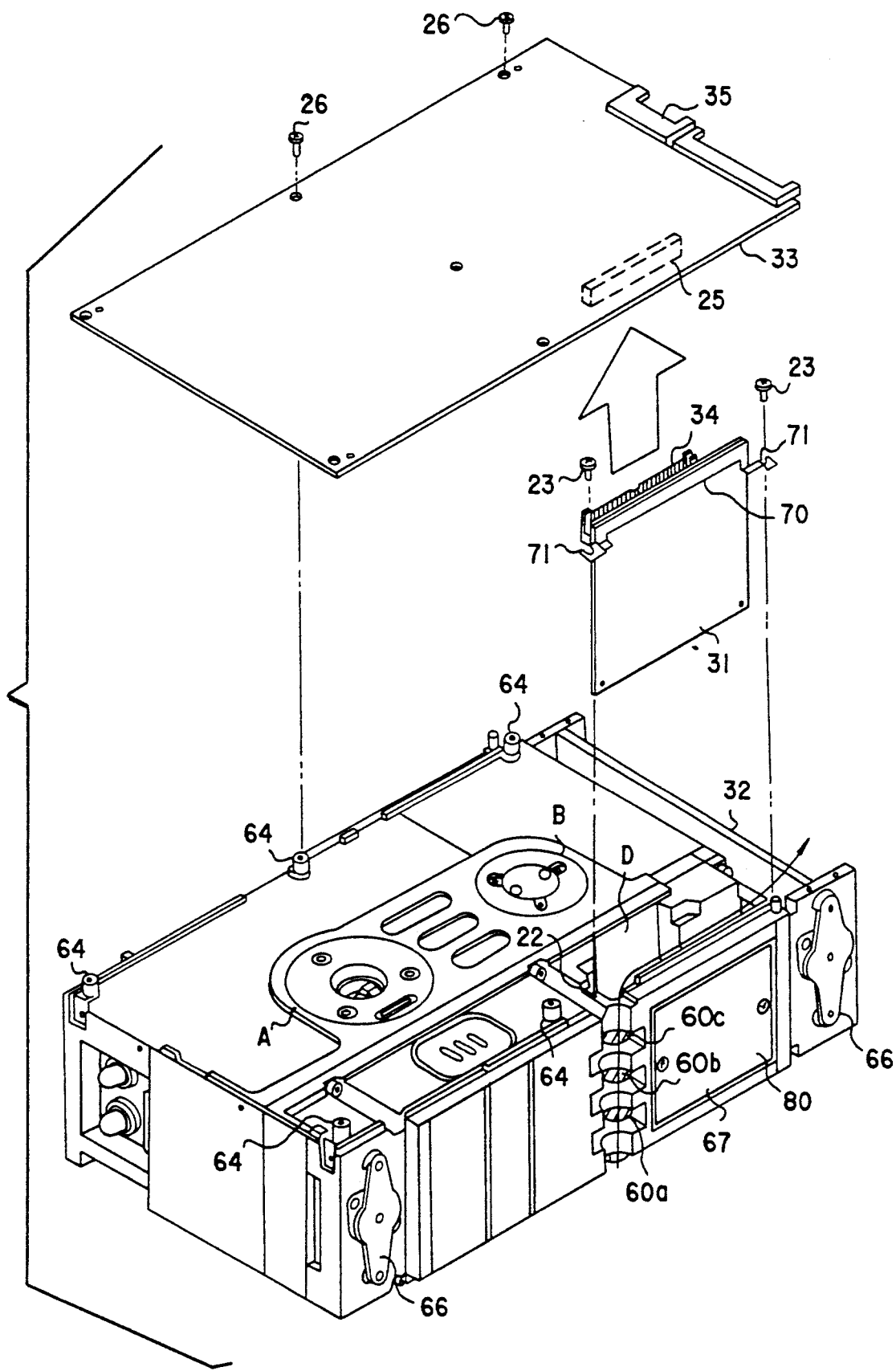
FIG. 2 is a perspective view of a magnetic disk unit embodying the present invention.

FIG. 2 shows the structure of a magnetic disk unit of the present invention.

A plurality of magnetic disks 2 rotated by spindle motor 19 (See FIG. 3.) are on the A side, and a positioner for positioning heads 9 is on the B side.

Figure 1:
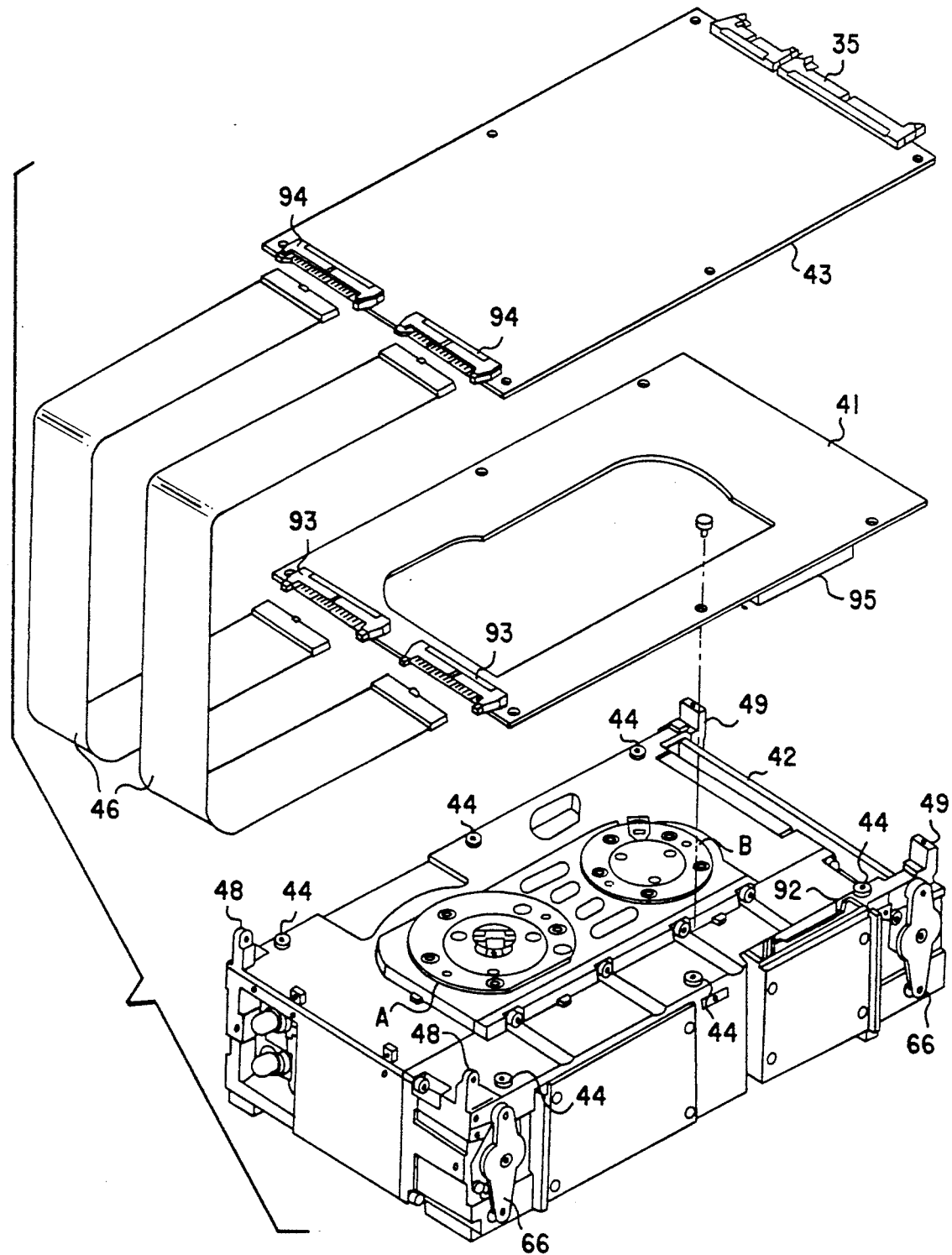
FIG. 1 is a perspective view of a magnetic disk unit for illustrating the structure of a related art of the present invention.
Figure 4:
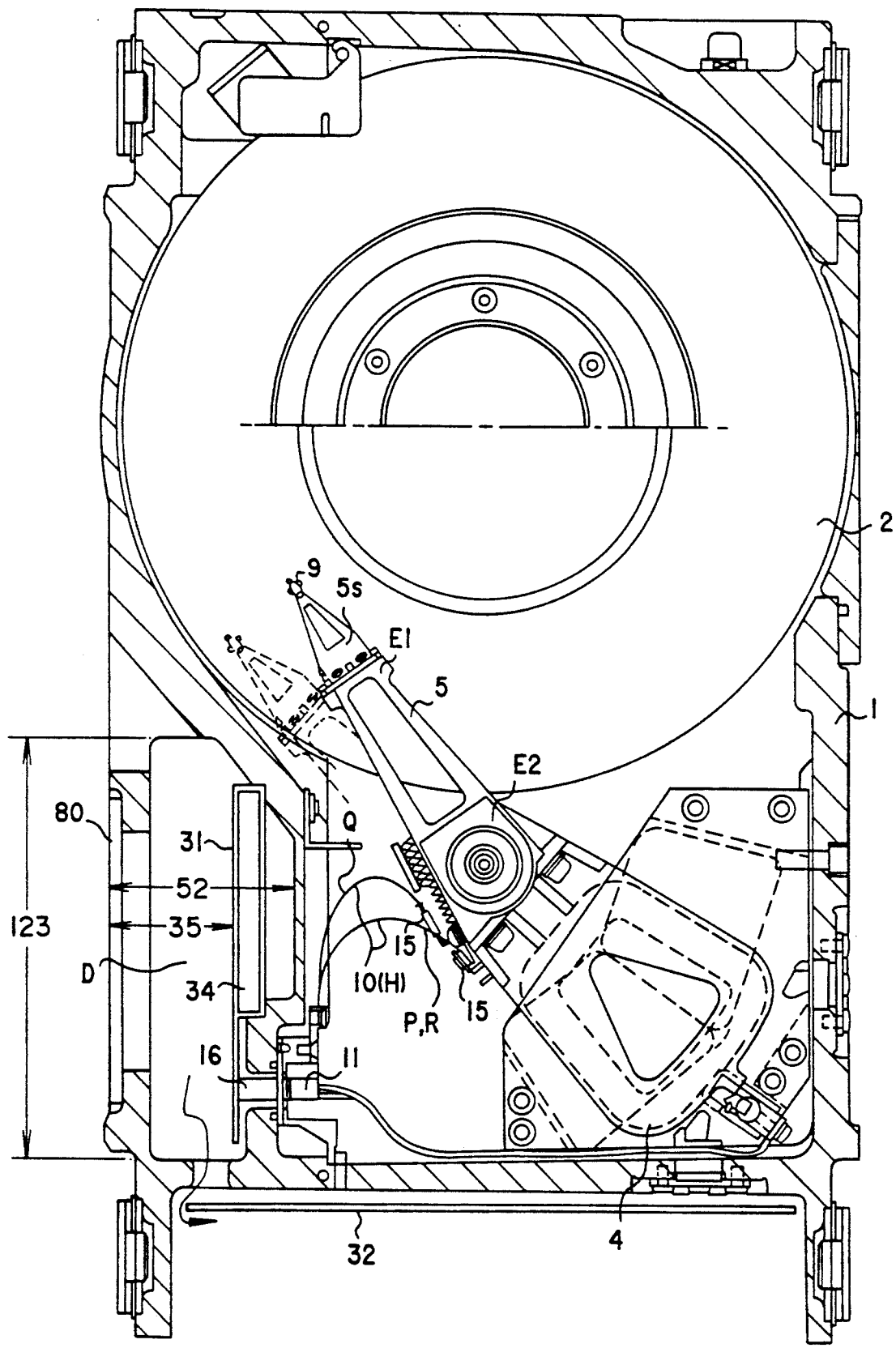
FIG. 4 is a top plan view of the positioner of the present invention.

First, the present invention has depressed a part of base 1 (depicted by D in FIGS. 2, 4 and 5) in a space evacuated by employing a straight-type arm (which is constructed such that arm 5 and spring arm 5s (See FIG. 4) supporting read/write heads are oriented lengthwise substantially in the same direction. See, for example, U.S. Pat. No. 4,620,251.) in place of a conventional dog-leg shaped arm. Second, it has heightened base 1. Third, it has provided a structure for mounting a printed circuit board (112mm(W)×108mm(H)×10mm(D)) in the depressed portion D. (For dimensions, see FIG. 4.) This has been realized because, as shown in FIG. 4, straight-type arm swings over the area from the broken-line arm position to a little inner position of that of the solid line, and a large-capacity magnetic disk unit (216mm(W)×127mm(H)×380mm(D)) having 8 disks as shown in FIG. 1 has height enough to house a printed circuit board of above-mentioned size. Second PCA 33 mounts an interface circuit for receiving and sending commands and disk read/write data to/from a not-depicted disk controller via connector 35. Second PCA 33 also mounts circuits for controlling currents flowing through the voice coil wound on bobbin 4 which is secured to arm 5, according to the difference of the current arm position from the desired position so that heads 9 can be positioned on a desired disk track. First and third PCAs 31, 32 mount circuits for wave-shaping, amplifying and alemodulating read signals from heads 9 and for modulating write signals to heads 9. Third PCA 32, which is mounted on the rear side of the unit as was conventional PCA 42, is connected to second PCA 33 via their connectors (not depicted in the figure).

The functions of conventional first PCA 41 has been distributed to PCAs 31, 32 and 33 to exclude conventionally-needed first PCA 41. Newly-provided first PCA 31, which has above-mentioned functions, has been mounted in depressed portion D because portion D is located close to read/write heads.

Figure 3:
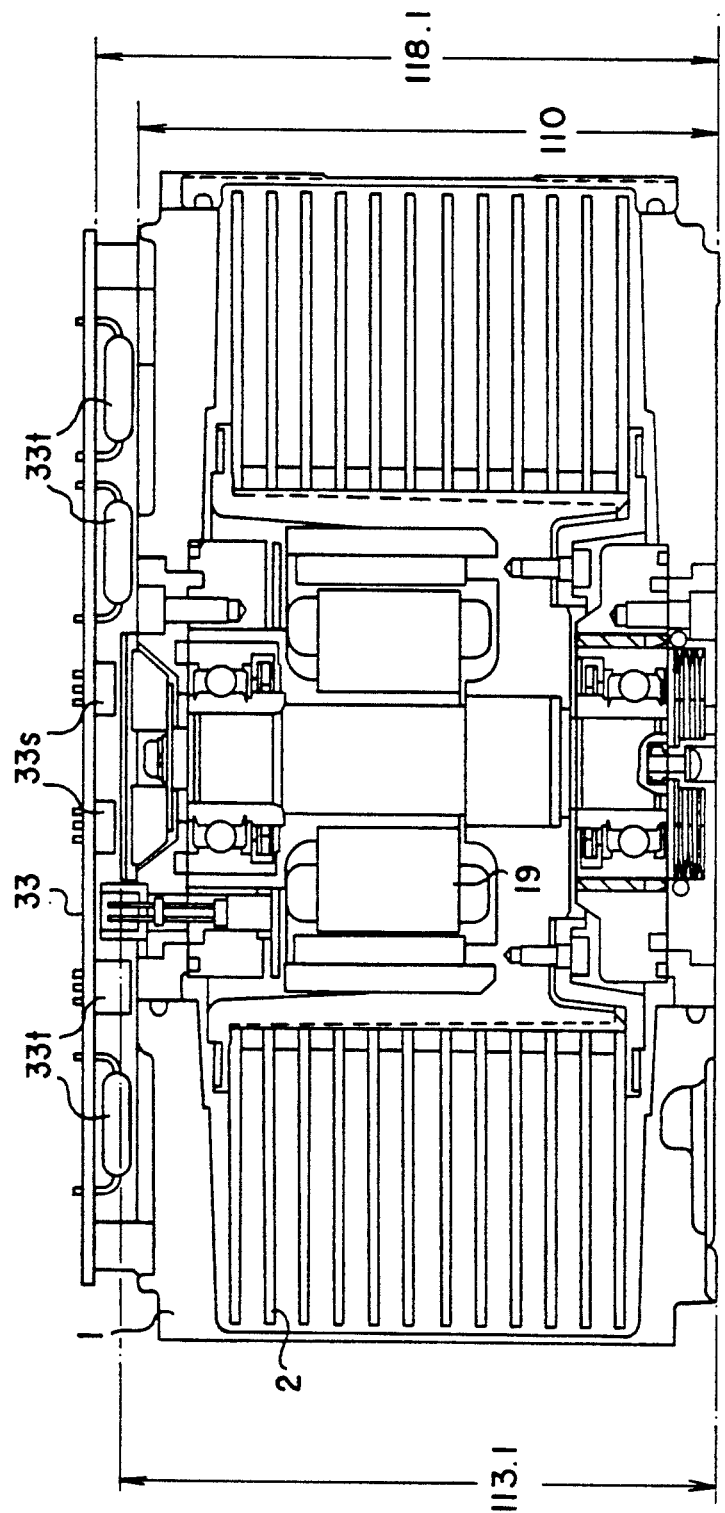
FIG. 3 is a sectional view of a magnetic disk unit embodying the present invention.

With reference to FIG. 3, PCA 33 is placed on top of the unit with parts side down, and particularly with taller parts 33t mounted in deep portions of base 1 while shorter parts 33s in shallow portions (or in the center of PCA 33) to make base 1 as high as possible within a limited height. Thus, the present invention has made it possible to add disks to increase storage capacity. When applied to a disk unit having 8 disks as shown in FIG. 1, in addition to the improvement to reduce the pitch disks are disposed with, the present invention permits to add 4 more disks to total 12 disks as shown in FIG. 3.

Figure 5:
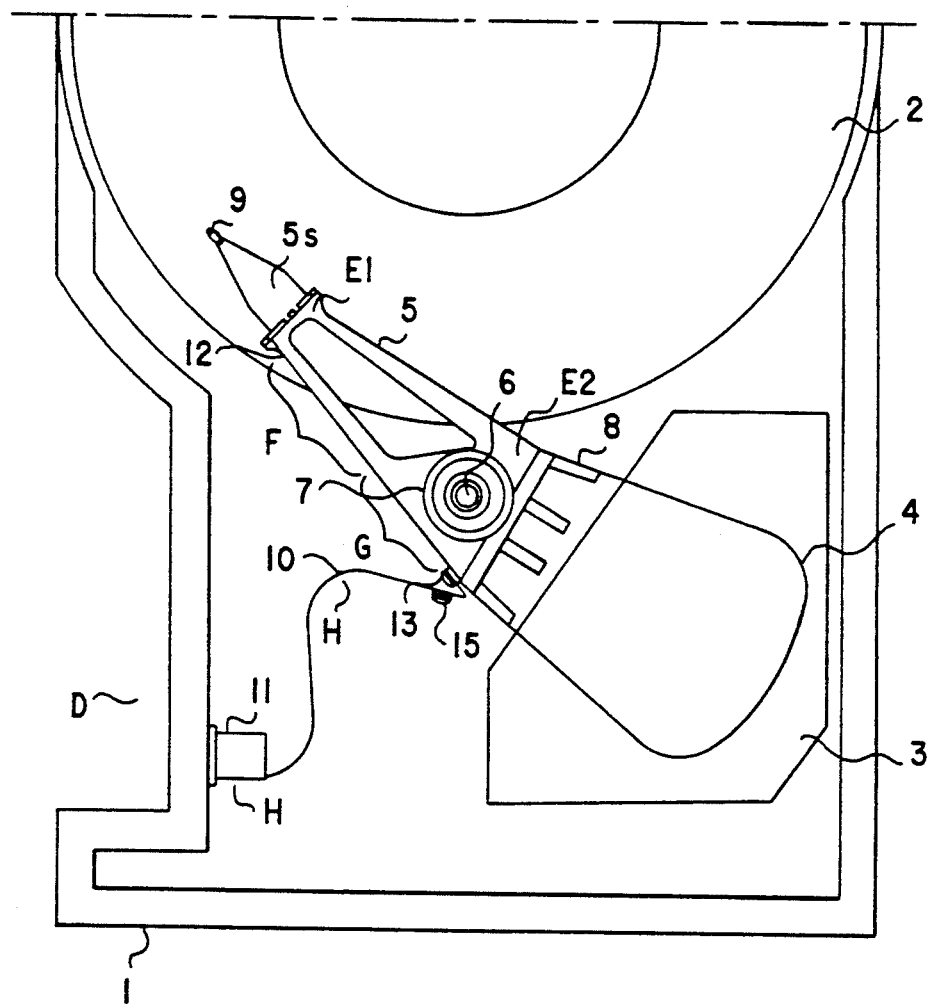
FIG. 5 is a diagramatic top plan view showing the positioner of the present invention.

With reference to FIGS. 4 and 5 which show the structure of the positioner part of the magnetic disk shown in FIG. 2.

Base 1 (hatched in FIG. 4) houses the mechanical and electronic parts constituting a magnetic disk unit, such as magnetic disks 2, arm 5, heads 9, and magnetic circuit 3 having permanent magnets 41 (See FIG. 6.) and voice coil-wound bobbin 4. Arm 5 has heads 9 at first end E1 and, at second end E2, bearing 7 and bobbin 4. Bobbin 4 is connected to arm 5, reinforced by ribs 8, and supported rotatably on rotational member 6 by bearing 7. When a current flows through the voice coil (not depicted in the figure) wound on bobbin 4, bobbin 4 moves horizontally (e.g. clockwise) about the axis of rotational member 6, and arm 5 in the opposite direction (e.g. counterclockwise), thus positioning heads 9 on a desired track.

Figure 6:
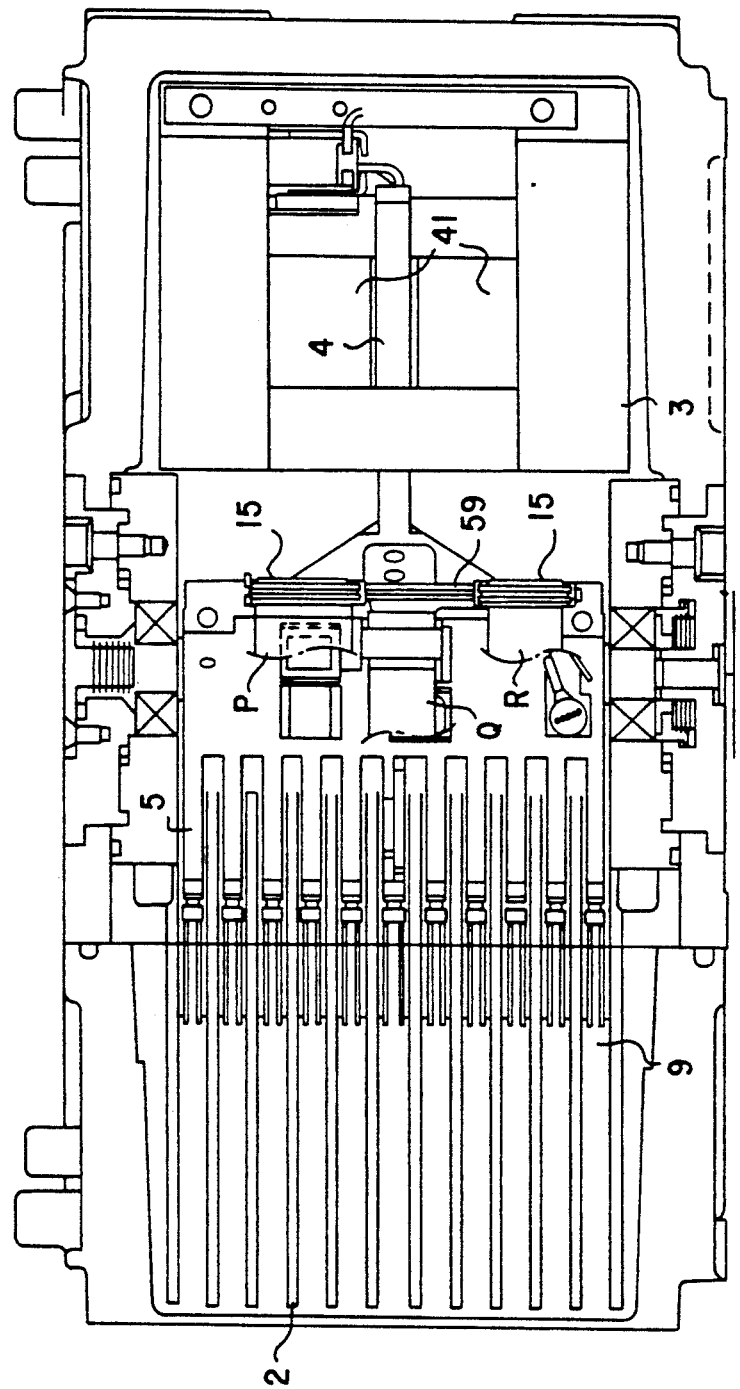
FIG. 6 is a side elevational view of the positioner of the present invention.

A magnetic disk unit with 22 disk surfaces on 12 disks as shown in FIG. 6, requires 1 head per disk surface, a total of 22 heads. Therefore, head ICs (integrated circuits for amplifying read/write signals to/from heads 9) are needed corresponding to the number of heads. Moreover, the head ICs must be placed as close to heads 9 as possible to minimize the capacitance, inductance and resistance offered by wiring. Hence, flexible printed circuit board (called FPC hereafter) 10 is utilized to mount the head ICs and to carry disk read/write signals and power for the voice coil on bobbin 4 to/from terminal 11, which is mated with connector 16 to connect newly-provided first PCA 31. (See FIG. 4.) As shown in FIG. 5, FPC 10 consists of three parts: parts F and G, both stuck to arm 5, and part H. Part F is divided into as many portions as the number of heads 9 with its tips soldered (solder 12) to first end E1 of arm 9 to wire between heads 9 and the head ICs. Part G mounts head ICs. Part H is divided into three portions P, Q and R at second end E2 of arm 5 and leads to terminal 11. Portion Q carries power for the voice coil; and portions P, R carry disk read signals to second PCA 33 via terminals 11 and 16, first PCA 31, and connectors 34 and 25; and disk write signals in the reverse order.

Part H (portions P, Q, R) of FPC 10 needs slack enough to allow arm 5 to move freely over disks 2. However, a problem is that, as a result of depressing base 1 (depressed portion D), terminal 11 has come near to magnetic circuit 3, which causes FPC 10 (part H) to rub against magnetic circuit 3, damaging each other and producing dust and powder.

As shown in FIGS. 4 and 5, the present invention overcomes the problem by attaching bending metals 15 at second end E2 of arm 5 and thereby diverting the FPC's route to terminal 11 to prevent FPC 10 from touching magnetic circuit 3.

Figure 7:
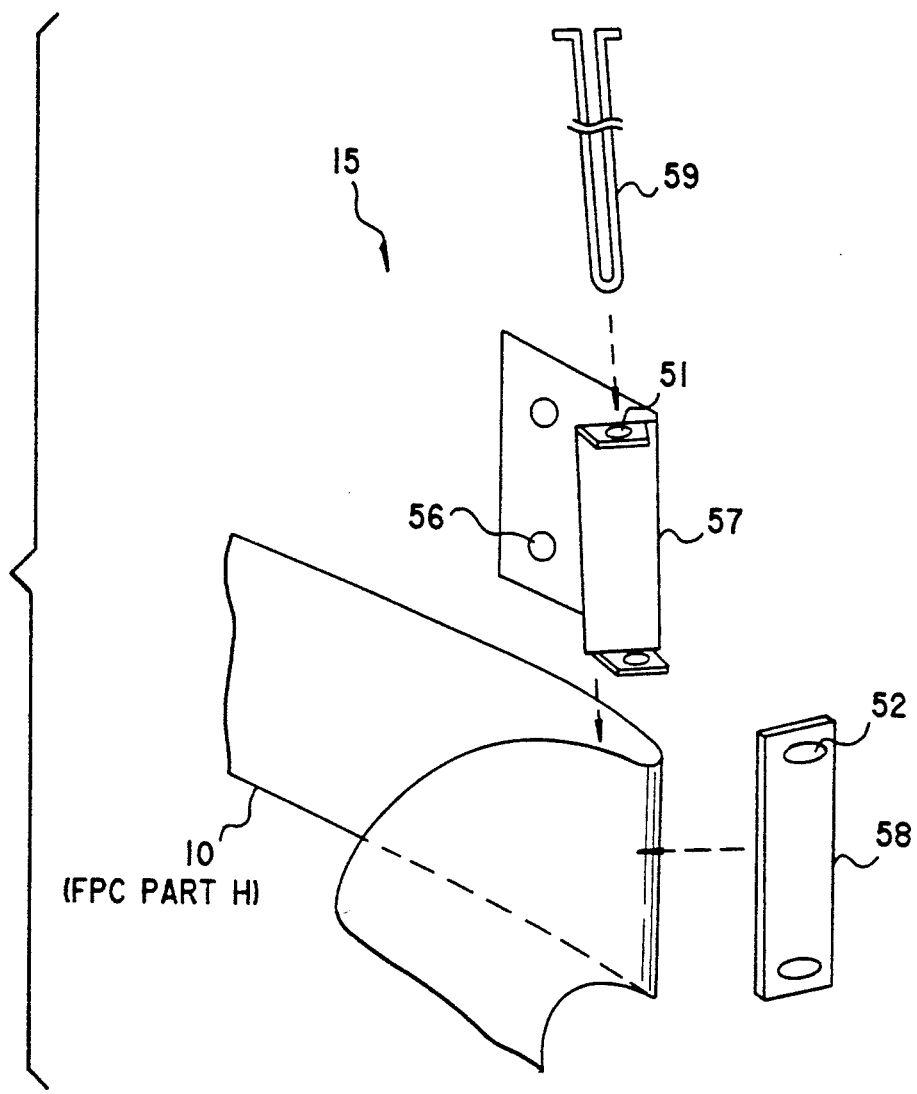
FIG. 7 is an exploded view of a bending metal.

FIG. 7 illustrates an example of the structure of above-mentioned bending metal 15 in more detail. Bending metal 15 consists of L-shaped metal fitting 57, plate 58 which presses FPC 10 against metal fitting 57, and pin 59 which locks plate 58 to metal fitting 57. Metal fitting 57 has holes 56 on one side of the metal bent in an acute angle and holes 51 on the other side. Holes 56 are for securing metal fitting 57 and FPC 10 to arm 5. Holes 51 are for inserting pin 59 to fasten FPC 10 between metal fitting 57 and plate 58. In FIG. 6, a single pin 59 locks two sets of plate 58 and metal fitting 57 to fasten portions P and R in common. When secured to bending metal 15, FPC 10 takes its route apart from magnetic circuit 3 to terminals 11, thus preventing FPC 10 from touching magnetic circuit 3 in seek modes in which arm 5 swings over magnetic disks 2 to selectively position heads 9, and therefore preventing production of dust and powder and disconnection of the signal lines in FPC 10.

In FIGS. 4 and 5, portions P and R of FPC 10 are guided by bending metals 15 which is illustrated in FIG. 7 in detail; and portion Q is guided by another bending metal of a similar type.

Figure 8A:
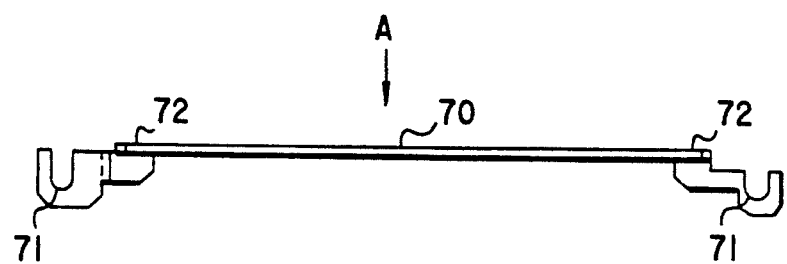
FIG. 8(a) shows a plate for securing a printed circuit board to the base and FIG. 8(b) shows a side view of FIG. 8(a)
Figure 8B:
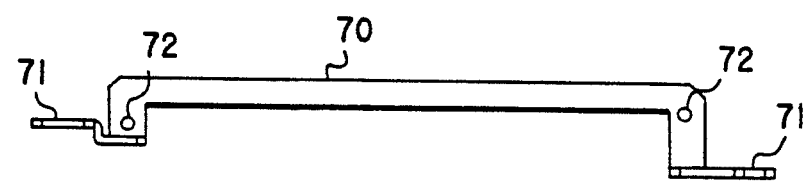

FIG. 8(a) shows plate 70 for securing first PCA 31 to base 1. FIG. 8(b) is a side view of FIG. 8(a), viewed from arrow A. Plate 70 is screwed to first PCA 31 through holes 72. In FIG. 2, first PCA 31 is screwed (screws 23) to base 1 through holes 71 of plate 70 and holes 22 of base 1. On mounting second PCA 33 on the upper side of the unit by screwing (screws 26) to spacer tubes 64, its connector 25 is mated with connector 34 of first PCA 31 to connect signal lines of both PCAs.

Figure 9:
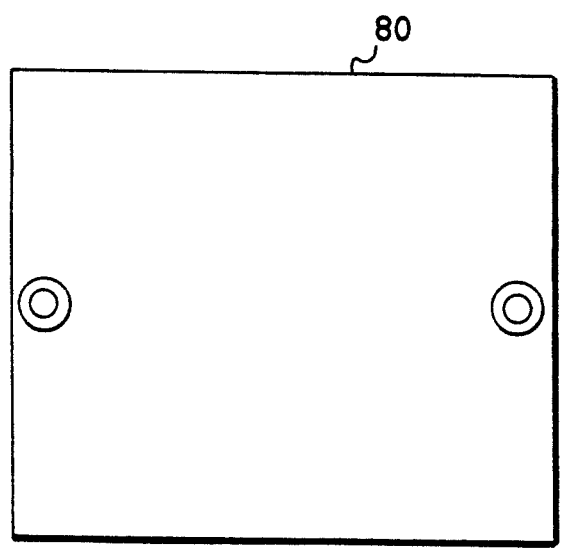
FIG. 9 shows a window cover.

With cover 80 (See FIG. 9.) attached by screwing, window 67 protects first PCA 31 from dust. With cover 80 detached, window 67 allows the waveforms of disk read/write signals to be observed while the unit is operating with first PCA 31 mounted on the unit. As shown in FIG. 2, three holes 60a, 60b and 60c are provided in base 1 to let the air from a not-depicted fan flows through. (In FIG. 2, only air flow through hole 60c is shown by an arrow. ) Since first PCA 31 is disposed vertically in parallel with the axis of rotational member 6 or with the side of the unit, air coming from the three holes flows through between first PCA 31 and cover 80 to second PCA 32 to cool both PCAs uniformly.

Thus, a printed circuit board which were mounted conventionally on the upper side of the unit (i.e. above disks 2) has been moved to the side of the unit. As a result, an empty space of approx. 10 mm in height has been provided above the disks, allowing an addition of 4 more disks to a conventional magnetic disk unit with, for example, 8-inch disks.

What is claimed is:

1. A disk unit comprising:
   a disk having a rotational axis thereof;

a read/write head, positioned onto said disk, for reading information out and/or writing information on said disk;

an arm, connected at one end to a rotational axis and at the other end to said readwrite head, for rotating said read/write head to a desired position of said disk;

a printed circuit board;

a flexible printed circuit board connecting said read/write head to said printed circuit board, said flexible printed circuit board having a first position extending along said arm and a second position extending away from said arm to said printed circuit board; and diverting means, connected to said arm, for changing said flexible printed circuit board from the first position to the second position and for changing a route the second position follows.

2. A disk unit according to claim 1, wherein said diverting means is an L-shaped fitting.

3. A disk unit according to claim 2 further comprising a locking plate which presses said flexible printed circuit board against said L-shaped fitting.

4. A disk unit according to claim 3 further comprising a pin which locks said locking plate to said L-shaped fitting.

5. A disk unit according to claim 1 further comprising a housing having a wall provided in parallel with the rotational axis of said disk, the wall having a depressed portion, and said printed circuit board connected to said read/write head and located in said depressed portion, said printed circuit board extending in parallel with he rotational axis of said disk.

6. A disk unit according to claim 5 wherein said printed circuit board mounts circuits which receive and send read/write signals from/to said read/write head.

7. A disk unit according to claim 5 wherein said diverting means is provided on a side of said arm which faces said depressed portion.

8. A disk unit according to claim 5 wherein said disk includes a plurality of disks and said read/write head includes a plurality of read/write heads.

* * * * *